United States Patent
Hayase et al.

(10) Patent No.: US 10,290,759 B2
(45) Date of Patent: May 14, 2019

(54) BACK CONTACT TYPE PEROVSKITE PHOTOELECTRIC CONVERSION ELEMENT

(71) Applicants: FUJICO CO., LTD., Kitakyushu-shi, Fukuoka (JP); KYUSHU INSTITUTE OF TECHNOLOGY, Kitakyushu-shi, Fukuoka (JP); CKD CORPORATION, Komaki-shi, Aichi (JP)

(72) Inventors: Shuzi Hayase, Kitakyushu (JP); Tingli Ma, Kitakyushu (JP); Hideaki Nagayoshi, Kitakyushu (JP); Daishiro Nomura, Kitakyushu (JP); Takatoshi Nomura, Komaki (JP)

(73) Assignees: FUJICO CO., LTD., Fukuoka (JP); KYUSHU INSTITUTE OF TECHNOLOGY, Fukuoka (JP); CKD CORPORATION, Aichi (JP)

( * ) Notice: Subject to any disclaimer, the term of this patent is extended or adjusted under 35 U.S.C. 154(b) by 0 days.

(21) Appl. No.: 15/915,321

(22) Filed: Mar. 8, 2018

(65) Prior Publication Data

US 2018/0261708 A1    Sep. 13, 2018

(30) Foreign Application Priority Data

Mar. 10, 2017   (JP) ................................. 2017-046142

(51) Int. Cl.
*H01L 31/068*  (2012.01)
*H01L 31/0224*  (2006.01)
(Continued)

(52) U.S. Cl.
CPC .. *H01L 31/0682* (2013.01); *H01L 31/022441* (2013.01); *H01L 31/18* (2013.01);
(Continued)

(58) Field of Classification Search
CPC ......... H01L 31/0682; H01L 31/022441; H01L 31/18
(Continued)

(56) References Cited

U.S. PATENT DOCUMENTS

| | | | | |
|---|---|---|---|---|
| 2008/0245410 | A1* | 10/2008 | Duerr ................. | H01G 9/2022 136/256 |
| 2013/0255761 | A1* | 10/2013 | Mathieson .......... | H01G 9/2068 136/256 |
| 2017/0162811 | A1* | 6/2017 | Li ...................... | H01L 51/4226 |

FOREIGN PATENT DOCUMENTS

JP    WO 2009/075101    *    6/2009

OTHER PUBLICATIONS

Kroon et al., Nanocrystalline Dye-Sensitized Solar Cells Having Maximum Performance, Progress in Photovoltaics: Research and Applications, vol. /Issue 15, pp. 1-18 (Year: 2007).*

(Continued)

*Primary Examiner* — Jayne L Mershon
(74) *Attorney, Agent, or Firm* — Westerman, Hattori, Daniels & Adrian, LLP

(57) ABSTRACT

A perovskite photoelectric conversion element includes a light transmitting substrate 11, on a front surface of which light is made incident, an oxide porous layer 13, formed on a rear surface of the light transmitting substrate 11 and with metal oxide particles 12 connected in a network, a metal porous layer 15, formed on a rear surface of the oxide porous layer 13 and with metal particles 14 connected in a network, a porous insulating layer 17, formed on a rear surface of the metal porous layer 15, a first electrode layer 18, formed on and across an entirety of a rear surface of the porous insulating layer 17, a second electrode layer 19, connected to the metal porous layer 15 and formed at a portion different from the first electrode layer 18 in a state of being insulated from the first electrode layer 18, and perovskite 20.

5 Claims, 6 Drawing Sheets

(51) Int. Cl.
*H01L 31/18* (2006.01)
*H01L 51/42* (2006.01)

(52) U.S. Cl.
CPC ........ *H01L 51/4253* (2013.01); *Y02E 10/549* (2013.01); *Y02P 70/521* (2015.11)

(58) Field of Classification Search
USPC ........................................................ 136/256
See application file for complete search history.

(56) References Cited

OTHER PUBLICATIONS

Xiao et al., "An all-solid-state perovskite-sensitized solar cell based on the dual function polyaniline as the sensitizer and p-type hole-transporting material," J. Power Sources, (2014), 267, pp. 1-8, Cited in Specification. (8 pages).

Sheikh et al., "Atmospheric effects on the photovoltaic performance of hybrid perovskite solar cells," Sol. Energ. Mat. Sol. C, (2015), vol. 137, pp. 6-14, wlEnglish Abstract, Cited in Specification. (3 pages).

Lang et al., "First-principles study on the electronic and optical properties of cubic ABX3 halide perovskites," Phys. Lett. A, (2014), vol. 378, pp. 290-293, w/English Abstract, Cited in Specification. (3 pages).

Sakai et al., "The mechanism of toluene-assisted crystallization of organic-inorganic perovskites for highly efficient solar cells," J. Mater. Chem. A, (2016), 4, pp. 4464-4471, w/English Abstract, Cited in Specification. (3 pages).

\* cited by examiner

BACK CONTACT TYPE PEROVSKITE PHOTOELECTRIC CONVERSION ELEMENT

FIELD OF THE ART

The present invention relates to a back contact type perovskite photoelectric conversion element.

BACKGROUND ART

Perovskite photoelectric conversion elements (perovskite solar cells) have such advantages as being high in power generation efficiency in comparison to dye-sensitized solar cells, being high in visible light utilization efficiency in comparison to silicon solar cells, being excellent in deformability due to being a thin film, being low in manufacturing cost due to enabling the thin film to be formed by solution coating and drying, etc., and are being actively researched in recent years (see, for example, Non-Patent Documents 1 to 4).

PRIOR ART DOCUMENT

Non-Patent Document

[Non-Patent Document 1] Xiao, Y.; Han, G.; Chang, Y.; Zhou, H.; Li, M.; Li, Y., "An all-solid-state perovskite-sensitized solar cell based on the dual function polyaniline as the sensitizer and p-type hole-transporting material," J. Power Sources 2014, 267, 1-8.

[Non-Patent Document 2] Sheikh, A. D.; Bera, A.; Hague, M. A.; Rakhi, R. B.; Gobbo, S. D.; Alshareef, H. N.; Wua, T., "Atmospheric effects on the photovoltaic performance of hybrid perovskite solar cells," Sol. Energ. Mat. Sol. C2015, 137, 6-14.

[Non-Patent Document 3] Lang, L.; Yang, J.-H.; Liu, H.-R.; Xiang, H. J.; Gong, X. G., "First-principles study on the electronic and optical properties of cubic $ABX_3$ halide perovskites," Phys. Lett. A, 2014, 378, 290-293.

[Non-Patent Document 4] Sakai, N.; Pathak, S.; Chen, H.-W.; Haghighirad, A. A.; Stranks, S. D.; Miyasak, T.; Snaith, H. J., "The mechanism of toluene-assisted crystallization of organic-inorganic perovskites for highly efficient solar cells," J. Mater. Chem. A 2016, 4, 4464-4471.

SUMMARY OF THE INVENTION

Problem to be Solved by the Invention

In modularizing a conventional perovskite photoelectric conversion element, there arises a need to provide a metal wiring as a bus bar on a front surface (light receiving surface) of the perovskite photoelectric conversion element. Thereafter, a portion of light incident on the perovskite photoelectric conversion element is blocked by the metal wiring and there is thus a problem that the perovskite photoelectric conversion element decreases in power generation efficiency when it is modularized. Also, with a perovskite photoelectric conversion element, due to use of an expensive transparent conductive oxide, there are problems that the manufacturing cost cannot be reduced and incident light attenuates when it passes through a transparent conductive oxide layer such that sufficient light does not reach the perovskite layer.

A back contact type perovskite photoelectric conversion element that does not require a metal wiring even when it is modularized and furthermore does not use an expensive transparent conductive oxide has thus been proposed. However, in preparing a back contact type perovskite photoelectric conversion element, a plurality of positive electrodes and a plurality of negative electrodes are formed in alternating alignment using lithography, a manufacturing process is complex and a problem arises in that the manufacturing cost increases rather in comparison to a case of using the expensive transparent conductive oxide.

The present invention has been made in view of the above circumstances and an object thereof is to provide a back contact type perovskite photoelectric conversion element, with which a transparent conductive oxide layer and a hole extraction layer are not present and positive and negative electrodes are provided separately.

Means for Solving the Problems

A back contact type perovskite photoelectric conversion element according to the present invention that meets the above object includes a light transmitting substrate, on a front surface of which light is made incident, an oxide porous layer, formed on a rear surface of the light transmitting substrate and with metal oxide particles connected in a network, a metal porous layer, formed on a rear surface of the oxide porous layer and with metal particles connected in a network, a porous insulating layer, formed on a rear surface of the metal porous layer, a first electrode layer, formed on and across an entirety of a rear surface of the porous insulating layer, a second electrode layer, connected to the metal porous layer and formed at a portion different from the first electrode layer in a state of being insulated from the first electrode layer, and perovskite, filled continuously inside the respective pores of the oxide porous layer, the metal porous layer, and the porous insulating layer, and where oxide layers of the metal particles are formed on surface layers of the metal particles in contact with the perovskite.

The back contact type perovskite photoelectric conversion element includes the oxide porous layer, the metal porous layer, the porous insulating layer, and the first electrode layer successively on the rear surface of the light transmitting substrate, the front surface of which serves as a light receiving surface, and the perovskite is filled continuously in the respective pores of the oxide porous layer, the metal porous layer, and the porous insulating layer and therefore, when light is irradiated on the perovskite in the oxide porous layer via the light transmitting substrate, charge separation into electrons and holes occurs and the generated electrons and holes move (diffuse) inside the perovskite toward the rear surface side (first electrode layer side). The thin oxide layers (with a thickness of 1 to 100 nm) of the metal particles are formed at the surface layers of the metal particles constituting the metal porous layer and therefore, when the electrons and holes moving inside the perovskite approach the metal porous layer and pass through inside the perovskite in the metal porous layer, the holes moving inside the perovskite cannot approach the metal porous layer due to the oxide layers present on the surface layers of the metal particles that constitute the metal porous layer. On the other hand, the electrons moving inside the perovskite can approach the metal porous layer even if the oxide layers are present on the surface layers of the metal particles. The electrons are therefore selectively captured by the metal porous layer from inside the perovskite and just the holes move through the perovskite inside the metal porous layer to the rear surface side. Consequently, the electrons generated by irradiating light on the perovskite gather in the second electrode layer via the metal porous layer, the holes pass through the perovskite in the porous insulating layer and gather in the first electrode layer, and photovoltage is generated between the first and second electrode layers.

Preferably, in the back contact type perovskite photoelectric conversion element according to the present invention, the oxide porous layer has a thickness not less than 50 nm and not more than 2000 nm and the metal oxide particles are any one of titanium oxide particles, zinc oxide particles, indium oxide particles, tin oxide particles, aluminum oxide particles, silicon oxide particles, yttrium oxide particles, and zirconium oxide particles.

It is not preferable for the thickness of the oxide porous layer to be less than 50 nm because the amount of perovskite that can be present inside the oxide porous layer will then be low and power generation efficiency will decrease due to the number of electron and hole pairs, formed by irradiation of light, being low. On the other hand, it is not preferable for the thickness of the oxide porous layer to exceed 2000 nm because, although the amount of perovskite present inside the oxide porous layer will then be high and the number of electron and hole pairs, formed by irradiation of light, will increase, a time (dwell time) during which the electrons and holes move inside the perovskite will be lengthened such that recombination will be high in frequency and the power generation efficiency will decrease. The perovskite inside the oxide porous layer is continuous with the perovskite inside the metal porous layer and therefore the electrons and holes can move from the perovskite inside the oxide porous layer to the perovskite inside the metal porous layer.

An action of the oxide porous layer is to enlarge a surface area of the perovskite present at a light receiving side to allow the perovskite to absorb a large amount of light and therefore the type of metal oxide particles is not restricted in particular and may be arbitrarily selectedaccording to purpose. By using any one of titanium oxide particles, zinc oxide particles, indium oxide particles, tin oxide particles, aluminum oxide particles, silicon oxide particles, yttrium oxide particles, and zirconium oxide particles, an oxide porous layer that is excellent in stability can be formed easily.

In particular, when the metal oxide particles are one of titanium oxide particles, zinc oxide particles, indium oxide particles, and tin oxide particles, the oxide porous layer has semiconductor characteristics. Therefore, when the electrons moving inside the perovskite reach the oxide porous layer, the electrons can move inside the oxide porous layer, the electrons that move inside the oxide porous layer are prevented from recombining with the holes, and the power generation efficiency is thereby improved.

Preferably, in the back contact type perovskite photoelectric conversion element according to the present invention, the metal porous layer has a thickness not less than 30 nm and not more than 1000 nm and the metal particles are formed of any one of or a combination of any two or more of or an alloy of any one of titanium, copper, aluminum, and nickel.

It is not preferable for the thickness of the metal porous layer to be less than 30 nm because the metal porous layer will then be high in electrical resistance and collection efficiency of electrons will decrease. On the other hand, it is not preferable for the thickness of the metal porous layer to exceed 1000 nm because a time during which the electrons and holes move inside the perovskite in the metal porous layer will then be lengthened.

Here, the type of metal particles constituting the metal porous layer is not restricted in particular and may be arbitrarily selectedaccording to purpose. In particular, by forming the metal particles from any one of or a combination of any two or more of or an alloy of any one of titanium, copper, aluminum, and nickel, stable metal oxide layers can be formed easily on surfaces of the metal particles.

Also, by using metal particles, prepared by combining any two or more of titanium, copper, aluminum, and nickel, to form the metal porous layer, or by using metal particles, prepared using an alloy having any one of titanium, copper, aluminum, and nickel as a main component and having another metal (that is, a metal besides titanium, copper, aluminum, and nickel) as an added element (with an added amount being, for example, not more than 10% by mass), to form the metal porous layer, the metal porous layer can be improved in strength and corrosion resistance. For example, as an alloy having titanium as amain component, an alloy which is formed by adding not more than 10% by mass of any one of or a combination of any two or more of elements, such as palladium, ruthenium, chromium, nickel, tantalum, cobalt, etc., is preferable.

Preferably, in the back contact type perovskite photoelectric conversion element according to the present invention, the porous insulating layer has a thickness not less than 50 nm and not more than 1000 nm and the porous insulating layer has any one of aluminum oxide particles, silicon oxide particles, yttrium oxide particles, zirconium oxide particles, and indium oxide particles connected in a network.

It is not preferable for the thickness of the porous insulating layer to be less than 50 nm because the metal porous layer and the first electrode layer will then contact easily and the first electrode layer and the second electrode layer cannot be maintained in the insulated state. On the other hand, even if the thickness of the porous insulating layer is thickened to exceed 1000 nm, this is not preferable because the effect of maintaining the first electrode layer and the second electrode layer in the insulating state will be the same and yet the amount of material used to form the porous insulating layer will increase and a time required to form the porous insulating layer will become lengthened (manufacturing cost will increase). Here, the type of material constituting the porous insulating layer is not restricted in particular and may be arbitrarily selectedaccording to purpose. Aluminum oxide particles, silicon oxide particles, yttrium oxide particles, zirconium oxide particles, and indium oxide particles have insulating properties and therefore the porous insulating layer can be formed easily by disposing any one of these particles in a network.

Preferably, in the back contact type perovskite photoelectric conversion element according to the present invention, the first electrode layer is formed of any one of carbon, silver, platinum, and gold.

The material constituting the first electrode layer is not restricted in particular as long as it has conductivity and may be arbitrarily selectedaccording to purpose. By using anyone of carbon, silver, platinum, and gold, a first electrode that is excellent in stability can be formed.

Preferably, in the back contact type perovskite photoelectric conversion element according to the present invention, the metal constituting the second electrode layer is of the same material as the metal constituting the metal porous layer.

The material constituting the second electrode layer is not restricted in particular as long as it has conductivity and may be arbitrarily selected according to purpose. By making the metal constituting the second electrode layer and the metal constituting the metal porous layer be of the same material, formation of the metal porous layer and formation of the second electrode layer can be performed at the same time and connection of the metal porous layer and the second electrode layer can be enhanced.

Effects of the Invention

With the back contact type perovskite photoelectric conversion element according to the present invention, the metal porous layer, with the oxide layers formed on the surface layers of the metal particles in contact with the perovskite, is provided at an intermediate position between the light transmitting substrate and the first electrode layer and therefore when the electrons and the holes generated by light being irradiated on the perovskite at the light transmitting substrate side (inside the oxide porous layer) move inside the perovskite toward the rear surface side, the electrons can be captured selectively by the metal porous layer to enable charge recombination to be reduced and enable just the holes to reach the first electrode layer such that the first electrode layer can be formed across the entirety of the rear surface of the porous insulating layer and the second electrode layer, in contact with the metal porous layer, can be formed at the portion different from the first electrode layer. Consequently, there is no need to use lithography or other complicated operations to form a plurality of electrodes (positive electrodes) for holes and a plurality of electrodes (negative electrodes) for electrons in alternating alignment at the rear surface side of the porous insulating layer and therefore the back contact type perovskite photoelectric conversion element can be manufactured inexpensively and easily.

Also with the back contact type perovskite photoelectric conversion element according to the present invention, just the holes move inside the perovskite in the porous insulating layer toward the first electrode layer and therefore there is no need to provide a hole extraction layer between the first electrode layer and the perovskite and a manufacturing process can be shortened to enable the back contact type perovskite photoelectric conversion element to be manufactured even more inexpensively and easily.

MODE FOR CARRYING OUT THE INVENTION

Next, to aid in understanding the present invention, an embodiment embodying the present invention shall be described with reference to the attached drawings.

Figure 1:
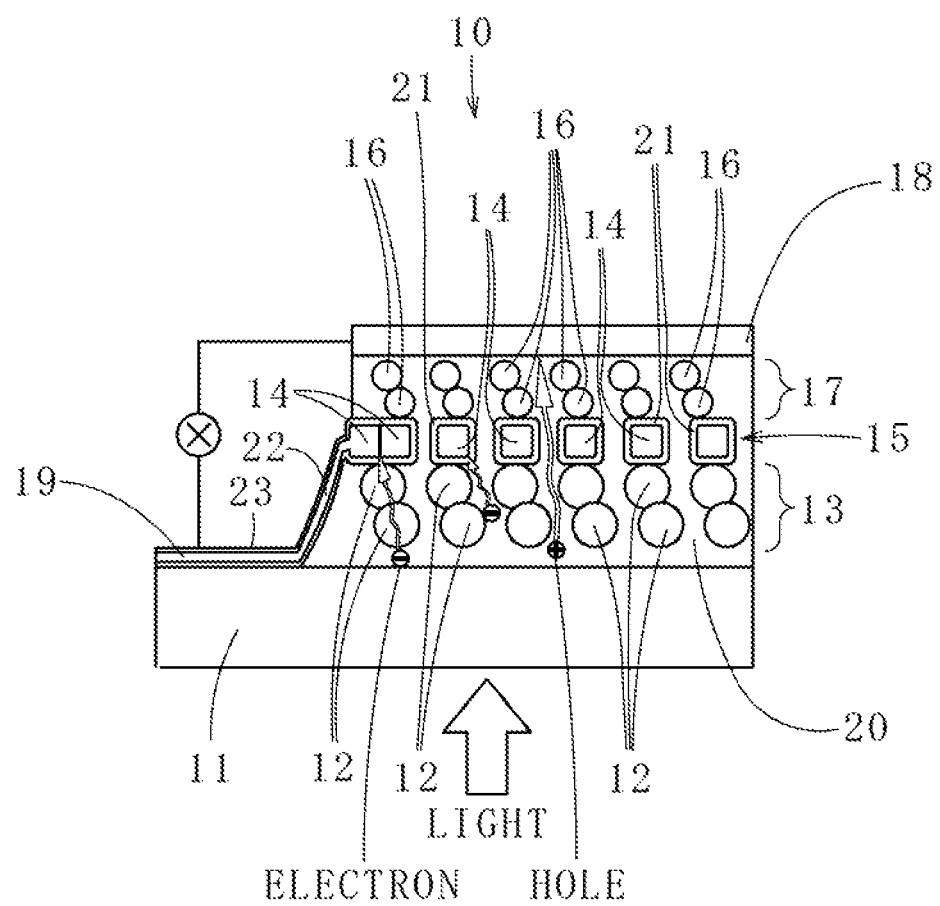
FIG. 1 is a sectional schematic view of a back contact type perovskite photoelectric conversion element according to an embodiment of the present invention.

As shown in FIG. 1, a back contact type perovskite photoelectric conversion element 10 according to an embodiment of the present invention includes a glass substrate 11 (example of a light transmitting substrate), on a front surface of which light is made incident, a titania porous layer 13 (example of an oxide porous layer), formed on a rear surface of the glass substrate 11 and with titanium oxide (titania) particles 12 (example of metal oxide particles) connected in a three-dimensional network, a titanium porous layer 15 (example of a metal porous layer) with titanium particles 14 (example of metal particles) formed on a rear surface of the titania porous layer 13, connected in a three-dimensional network, a zirconia porous layer 17 (example of a porous insulating layer), formed on a rear surface of the titanium porous layer 15 and with zirconium oxide (zirconia) particles 16 connected in a three-dimensional network, a gold electrode layer 18 (example of a first electrode layer), formed on and across an entirety of a rear surface of the zirconia porous layer 17, and a titanium electrode layer 19 (example of a second electrode layer), connected to the titanium porous layer 15 and formed at a portion adjacent to the titania porous layer 13 on the rear surface of the glass substrate 11 (example of a portion different from the first electrode layer) in a state of being insulated from the gold electrode layer 18.

The back contact type perovskite photoelectric conversion element 10 further includes perovskite 20, filled continuously inside the respective pores of the titania porous layer 13, the titanium porous layer 15, and the zirconia porous layer 17. Also, titanium oxide layers 21 (example of oxide layers of the metal particles) are formed on surface layers of the titanium particles 14, constituting the titanium porous layer 15 and being in contact with the perovskite 20. Here, the perovskite 20 indicates a compound expressed by a general formula, $ABX_3$, with A being an organic group, B being a metal, and X being a halogen, and for example, $CH_3NH_3PbI_3$, with which $CH_3NH_3$ is the organic group, lead (Pb) is the metal, and iodine (I) is the halogen, may be used. Also, by making the metal porous layer be the titanium porous layer 15, corrosive resistance against the iodine in the perovskite 20 can be exhibited to enable lengthening of life of the back contact type perovskite photoelectric conversion element 10. A detailed description shall now be provided.

The titania porous layer 13 has a thickness not less than 50 nm and not more than 2000 nm and by the titanium oxide particles 12 with a particle diameter not less than 10 nm and not more than 300 nm being connected in the three-dimensional network, continuous pores with a pore diameter of 10 to 300 nm are formed. By making the thickness of titania porous layer 13 not less than 50 nm and not more than 2000 nm, a proportion of a portion in the perovskite 20 that is irradiated with light can be raised and a large number of electrons and holes can be generated by irradiation of light.

The electrons and holes generated in a region of the perovskite 20 present inside the titania porous layer 13 move inside this region toward the rear surface side. Here, titanium oxide, which constitutes the titania porous layer 13 (titanium oxide particles 12) has semiconductor characteristics and an upper boundary energy of a valence band of titanium oxide is lower than an upper boundary energy of a valence band of perovskite. The holes are thus driven out from surfaces of the titanium oxide particles 12 and just the electrons can enter inside the titanium oxide particles 12. The electrons that enter inside the titanium oxide particles 12 can pass through inside the continuous titanium oxide particles 12 (titania porous layer 13). Consequently, the electrons moving inside the titania porous layer 13 are prevented from undergoing charge recombination with the holes and power generation efficiency is improved.

The titanium porous layer 15 has a thickness not less than 30 nm and not more than 1000 nm and by the titanium particles 14 with a particle diameter not less than 2 nm and not more than 50 nm being connected in the three-dimensional network, continuous pores with a pore diameter of 2 to 50 nm are formed. By making the thickness of titanium porous layer 15 not less than 30 nm and not more than 1000 nm, a time required for electrons to pass through the perovskite 20 inside the titanium porous layer 15 can be secured. Further, the titanium oxide layers 21, formed on the surfaces in contact with the perovskite 20, of the titanium particles 14 constituting the titanium porous layer 15, have characteristics of driving out holes and selectively capturing electrons.

Here, the titanium oxide layers 21 have a thickness of 1 to 100 nm. It is not preferable for the thickness of the titanium oxide layers 21 to be less than 1 nm because the surfaces of the titanium particles 14 cannot be covered uniformly with the titanium oxide layers 21 and the action of excluding the holes will degrade. On the other hand, it is not preferable for the thickness of the titanium oxide layers 21 to exceed 100 nm because a sheet resistance of the titanium porous layer 15 will then increase and the action of selectively capturing electrons will degrade.

Thus, when the electrons and the holes move from the perovskite 20 present inside the titania porous layer 13 to the perovskite 20 present inside the titanium porous layer 15, the electrons are selectively captured by the titanium porous layer 15 during the movement and just the holes pass through the perovskite 20 present inside the titanium porous layer 15 and move to the perovskite 20 present inside the zirconia porous layer 17. A rear surface side of the titania porous layer 13 and a front surface side of the titanium porous layer 15 are in contact with each other and therefore the electrons moving inside the titania porous layer 13 can move directly into the titanium porous layer 15.

The zirconia porous layer 17 has a thickness not less than 50 nm and not more than 1000 nm and by the zirconium oxide particles 16, with a particle diameter not less than 10 nm and not more than 50 nm, being connected in the three-dimensional network, continuous pores with a pore diameter of 10 to 50 nm are formed. Here, just the holes pass through the perovskite 20 present inside the titanium porous layer 15 and move to the perovskite 20 present inside the zirconia porous layer 17 and therefore there is no need to provide a hole extraction layer, which was required conventionally, and the holes can be captured directly by forming the gold electrode layer 18 on and across the entirety of the rear surface of the zirconia porous layer 17.

Here, the gold electrode layer 18, formed of gold, has a thickness not less than 10 nm and not more than 200 nm. It is not preferable for the thickness of the gold electrode layer 18 to be less than 10 nm because a sheet resistance of the gold electrode layer 18 will then increase. On the other hand, even if the thickness of the gold electrode layer 18 is thickened to exceed 200 nm, this is not preferable because the value of the sheet resistance of the electrode layer 18 will not change significantly and yet the amount of material used to form the gold electrode layer 18 will increase and a time required to form the gold electrode layer 18 layer will be lengthened (manufacturing cost will increase).

The titanium electrode layer 19 is not restricted in particular in regard to an installation position as long as the conditions of being connected to the titanium porous layer 15 are met. The titanium electrode layer 19 may thus be provided at a portion on the rear surface of the glass substrate 11 and adjacent to the titania porous layer 13 so as to be connected to the titanium porous layer 15 via a titanium connection portion 22 and the state of insulation with respect to the gold electrode layer 18 can be secured easily.

Next, a method for manufacturing the back contact type perovskite photoelectric conversion element 10 according to the embodiment of the present invention shall be described using FIGS. 2(A) to 2(F).

Figure 2A:
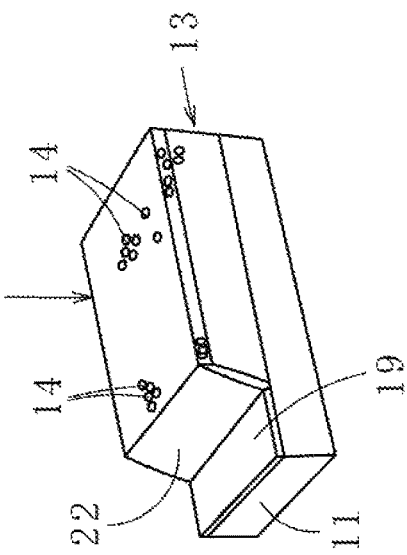
FIGS. 2(A) to 2(F) are schematic views for describing a manufacturing process for the back contact type perovskite photoelectric conversion element.
Figure 2B:
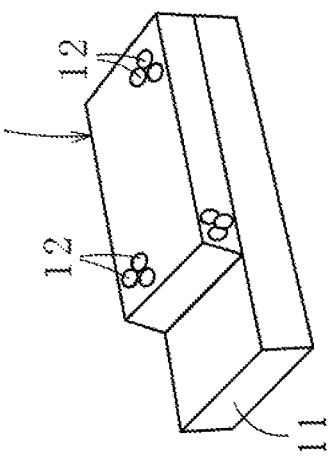

A slurry of the titanium oxide particles 12 with a particle diameter not less than 10 nm and not more than 300 nm (for example, particles prepared by a high temperature hydrolysis method, such as P25 made by Nippon Aerosil Co., Ltd., may be used) is prepared, a deposition layer of the titanium oxide particles 12 is formed by spin coating on the glass substrate 11, shown in FIG. 2(A) and having a thickness of 0.5 to 10 mm, and dried, and thereafter, sintering at a temperature of 400 to 600° C. is performed to form the titania porous layer 13 with a thickness not less than 50 nm and not more than 2000 nm as shown in FIG. 2(B).

Figure 2C:
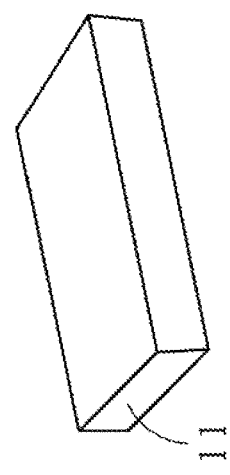

Next, sputtering, using titanium as a target, is performed on the titania porous layer 13 in an argon atmosphere at room temperature to respectively form the titanium porous layer 15, with a thickness not less than 30 nm and not more than 1000 nm and constituted of the titanium particles 14 with a particle diameter not less than 20 nm and not more than 50 nm, the titanium electrode layer 19, at a portion on the glass substrate 11 and adjacent to the titania porous layer 13, and the titanium connection portion 22, such that connects the titanium porous layer 15 and the titanium electrode layer 19 as shown in FIG. 2(C). Here, a state of a titanium layer formed by sputtering is influenced by a surface state of an underlayer, and the layer becomes a porous layer if unevenness is present on an underlayer surface as with the titania porous layer 13 and becomes a dense layer if the underlayer surface is smooth as with the glass substrate 11.

It was confirmed that, while the titanium porous layer 15, the titanium electrode layer 19, and the titanium connection portion 22 are exposed to atmospheric air at room temperature, the titanium reacts automatically with oxygen in the atmospheric air such that the titanium oxide layers 21 are formed on the surface layers of the titanium particles 14 constituting the titanium porous layer 15 and titanium oxide layers 23 are formed on surface layers of titanium particles respectively constituting the titanium electrode layer 19 and the titanium connection portion 22.

Figure 2D:
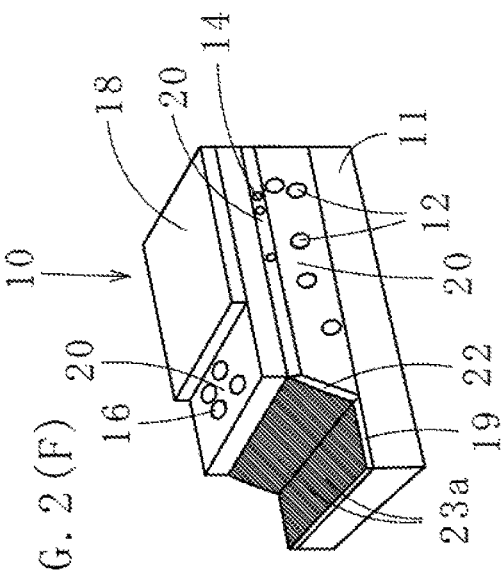
Figure 2E:
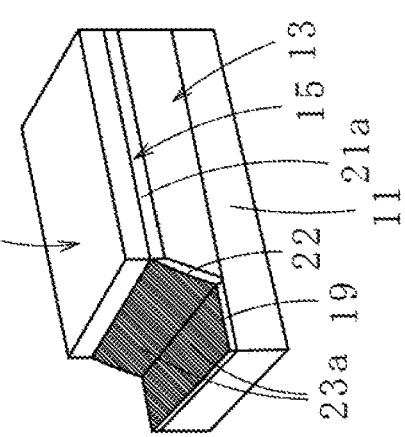
Figure 2F:
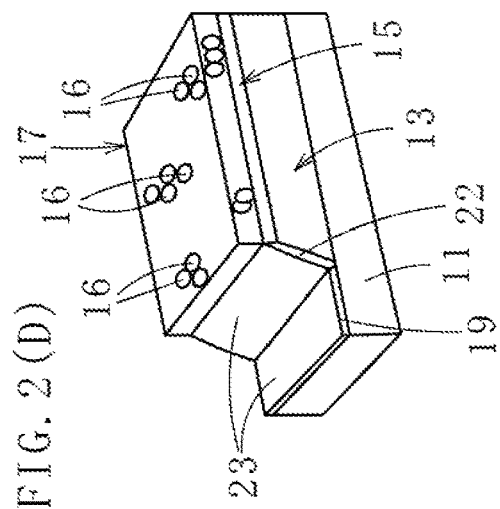

By forming masks on surfaces of the titanium connection portion 22 and the titanium electrode layer 19, a slurry of the zirconium oxide particles 16 with a particle diameter not less than 10 nm and not more than 50 nm is spin-coated on the titanium porous layer 15 to form a deposition layer of the zirconium oxide particles 16 as shown in FIG. 2(D) and the layer is dried. Next, heat treatment at a temperature of 300 to 500° C. is performed to form the zirconia porous layer 17 with a thickness not less than 50 nm and not more than 1000 nm as shown in FIG. 2(E).

The heat treatment conditions (temperature and treatment time) are set such that sintering among the zirconium oxide particles 16 is made possible while preventing vaporization of the titanium porous layer 15, the titanium connection portion 22, and the titanium electrode layer 19 due to heating and further such that the titanium oxide layers 21 of the titanium porous layer 15 become titanium oxide layers 21a of desired thickness and the titanium oxide layers 23 of the titanium electrode layer 19 and the titanium connection portion 22 become titanium oxide layers 23a of desired thickness.

In preparing the perovskite 20 ($CH_3NH_3PbI_3$), first, a $PbI_2$-containing body is prepared by allowing a $PbI_2$ solution to permeate inside the three-layer porous body, formed on the glass substrate 11 and constituted of the titania porous layer 13, titanium porous layer 15, and the zirconia porous layer 17. Next, the $PbI_2$-containing body is immersed in a $CH_3NH_3I$ solution to allow the $PbI_2$ present inside the pores inside the three-layer porous body to react with $CH_3NH_3I$ and form $CH_3NH_3PbI_3$ inside the pores inside the three-layer porous body.

The three-layer porous body, with which the $CH_3NH_3PbI_3$ (perovskite 20) is formed inside the pores, is dried and the gold electrode layer 18 with a thickness not less than 50 nm and not more than 200 nm is formed by thermal vapor deposition of gold on a surface of the zirconia porous layer 17.

The gold electrode layer may also be formed by coating and drying a slurry containing gold particles or sputtering a gold target on the surface of the zirconia porous layer 17.

EXAMPLES

A deposition layer of titanium oxide particles with a particle diameter of 20 to 250 nm was formed by spin coating on a glass substrate with a thickness of 10 mm and sintering at 500° C. was performed for 1.3 hours to form a titania porous layer with a thickness of 1 μm. Thereafter, a titanium target was sputtered in an argon atmosphere at room temperature to form a titanium porous layer with a thickness of 30 to 80 nm at a film thickness formation rate of 5 nm/min on the titania porous layer and form a dense titanium electrode layer with a thickness of 30 to 80 nm, connected to the titanium porous layer via a titanium connection portion with a thickness of 30 to 80 nm, at a portion on the glass substrate and adjacent to the titania porous layer. A deposition layer of zirconium oxide particles with a particle diameter of 10 to 300 nm was then formed by spin coating and heat treatment at 400° C. was performed for 1 to 2 hours to forma zirconia porous layer with a thickness of 150 nm.

Next, 80 microliters of a $PbI_2$ solution, with which 460 mg of $PbI_2$ were dissolved in 1 milliliter of N,N-dimethylformamide (DMF), were coated by spin coating (500 rpm for 5 seconds followed by 6000 rpm for 10 seconds) on a surface of the three-layer porous body, constituted of the titania porous layer, the titanium porous layer, and the zirconia porous layer formed on the glass substrate and left for 1 minute to allow the $PbI_2$ solution to permeate inside the three-layer porous body, which was then kept at 70° C. for 30 minutes. The three-layer porous body, with the $PbI_2$ solution permeated inside, was then immersed, together with the glass substrate, for 30 seconds in a $CH_3NH_3I$ (MAI) solution, with which 500 mg of $CH_3NH_3I$ were dissolved in 60 milliliters of isopropanol (IPA), to allow the $PbI_2$ and the $CH_3NH_3I$ to react to form $CH_3NH_3PbI_3$ inside the pores and was immediately thereafter immersed for 20 seconds in IPA to eliminate unreacted MAI. The three-layer porous body with the $CH_3NH_3PbI_3$ formed inside the pores was then dried and a gold electrode layer with a thickness of 100 nm was formed by thermal vapor deposition of gold on a surface of the zirconia porous layer to prepare a back contact type perovskite photoelectric conversion element.

Figure 3:
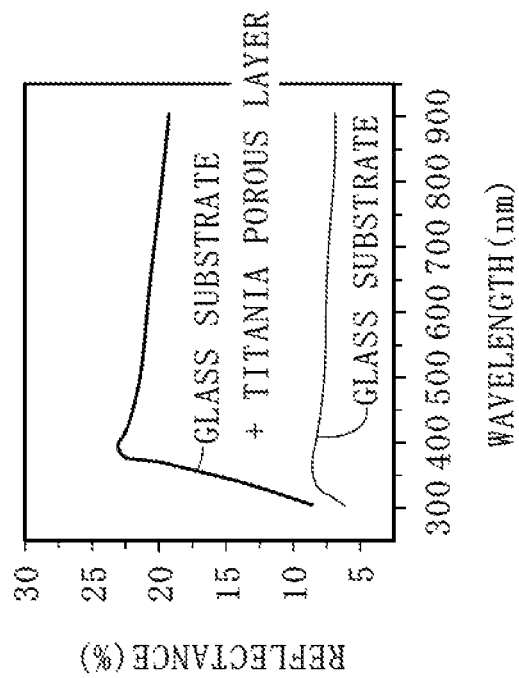
FIGS. 3(A) and 3(B) are graphs respectively showing a relationship between light absorption rate and wavelength and a relationship between light reflectance and wavelength of a titania porous layer in the examples.
Figure 3:
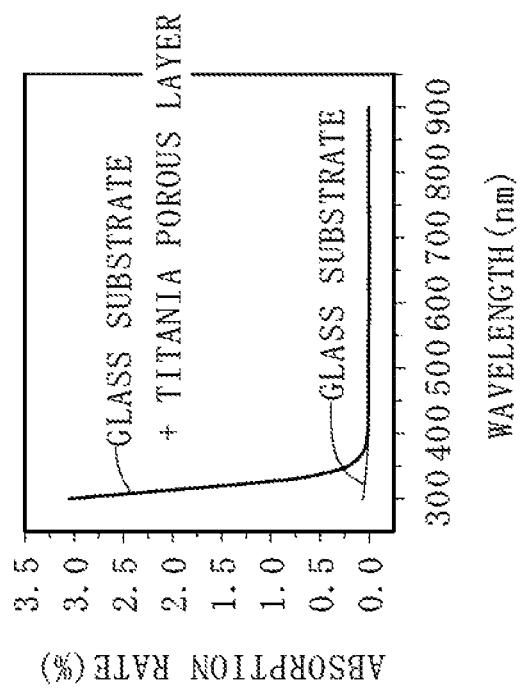

Absorption rate (%) and reflectance (%) of light by the titania porous layer when light is irradiated, via the glass substrate, on the titania porous layer formed on the glass substrate are shown respectively in FIGS. 3(A) and 3(B). Absorption rate (%) and reflectance (%) of light by the glass substrate when light is irradiated on the glass substrate are also shown in FIGS. 3(A) and 3(B).

From FIG. 3(A), it was confirmed that for light of wavelength not less than 400 nm, there is no difference in absorption rate (%) between the case where light is irradiated on the glass substrate and the case where light is irradiated on the titania porous layer via the glass substrate and light of wavelength not less than 400 nm is not absorbed by the titania porous layer. Also from FIG. 3(B), it was confirmed that the reflectance of the titania porous layer with respect to light of wavelength not less than 400 nm is 20 to 25%. It was thus found that light irradiated via the glass substrate can be contained inside the titania porous layer to irradiate the perovskite filled in the titania porous layer with light.

During the heat treatment at 400° C. performed in the process of forming the zirconia porous layer, an oxidation reaction between oxygen, contained in atmospheric air, and titanium progresses such that natural oxide layers present on surfaces of the titanium particles increase in thickness. Therefore, sheet resistance of the titanium porous layer was thus adopted as a measure that comprehensively expresses actions of the thickness of the titanium oxide layers on the surface layers of the respective titanium particles constituting the titanium porous layer. The sheet resistance was measured by a four-terminal method.

Figure 4B:
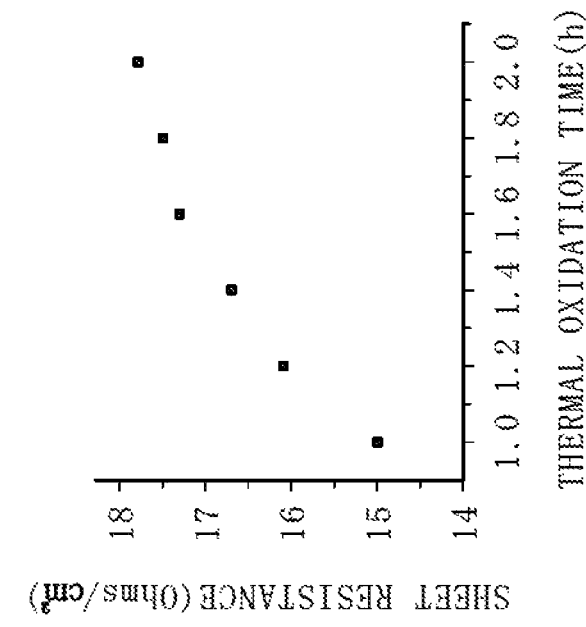
FIGS. 4(A) and 4(B) are graphs respectively showing a relationship between sheet resistance and thickness and a relationship between sheet resistance and oxidation time of a titanium porous layer in the examples.
Figure 4A:
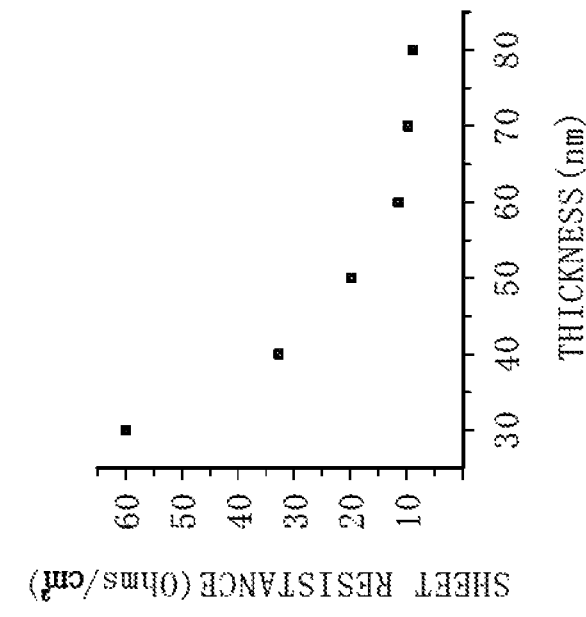

A relationship between the thickness of the titanium porous layer formed on the titania porous layer and the sheet resistance is shown in FIG. 4(A). Also, a relationship between time of heat treatment of the titanium porous layer with a thickness of 60 nm at 400° C., that is, oxidation time and the sheet resistance is shown in FIG. 4(B).

From FIG. 4(A), it was confirmed that the sheet resistance of the titanium porous layer decreases with increase in the thickness of the titanium porous layer and that at titanium porous layer thicknesses not less than 60 nm, there is exhibited a tendency for a rate of decrease in sheet resistance with increase in thickness of the titanium porous layer to decrease and converge to 11 ohms/$cm^2$. It was thus found that the thickness of the titanium porous layer should be made not less than 60 nm to lower the sheet resistance of the titanium porous layer.

FIG. 4(B) shows that as the time of heat treatment in forming the zirconia porous layer, that is, the time of thermal oxidation of the titanium porous layer increases, the sheet resistance of the titanium porous layer increases. When the thermal oxidation time exceeds 1.6 hours, a rate of increase in sheet resistance with increase in thermal oxidation time decreases and it is thus considered that the surfaces of the titanium particles, constituting the titanium porous layer, are completely covered with the dense oxide layers. Here, although the titanium oxide layers present on the surfaces of the titanium particles, constituting the titanium porous layer, have an action of excluding holes and selectively capturing electrons by the titanium porous layer and therefore the thickness of the titanium oxide layers must be adjusted to be within a predetermined range, depending on the conditions of the heat treatment performed in forming the zirconia porous layer, the thickness of the titanium oxide layers will increase excessively and the sheet resistance of the titanium porous layer will increase. It was thus found that the setting of the conditions of the heat treatment performed in forming the zirconia porous layer, that is, the conditions of the thermal oxidation of the titanium porous layer is important.

Figure 5A:
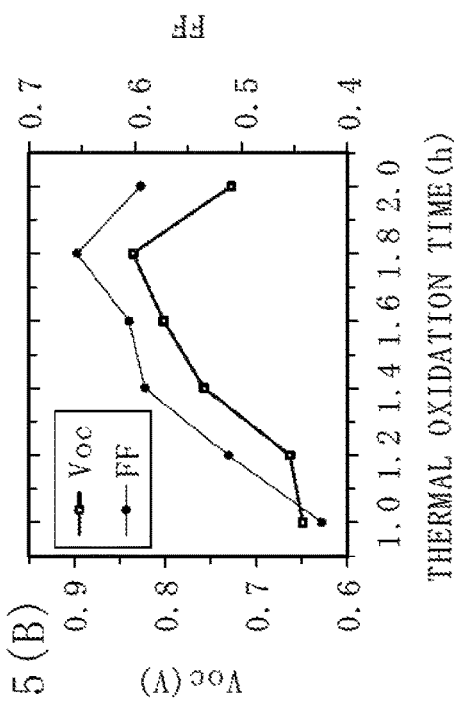
FIG. 5(A) is a graph showing relationships between thickness of the titanium porous layer and fill factor and between the thickness of the titanium porous layer and open circuit voltage.

The prepared back contact type perovskite photoelectric conversion element was provided with a black mask to arrange an exposure area of 0.12 cm$^2$ and using a solar simulator, power conversion efficiency (PCE), short-circuit current density (Jsc), fill factor (FF), and open circuit voltage (Voc) were respectively measured for evaluation of photoelectric conversion (solar cell) performance. FIG. 5(A) shows relationships between the thickness of the titanium porous layer and the open circuit voltage and between the thickness of the titanium porous layer and the fill factor, FIG. 5(B) shows relationships between the thermal oxidation time and the open circuit voltage and between the thermal oxidation time and the fill factor, FIG. 5(C) shows relationships between the thickness of the titanium porous layer and the power conversion efficiency and between the thickness of the titanium porous layer and the short-circuit current density, and FIG. 5(D) shows relationships between the thermal oxidation time and the power conversion efficiency and between the thermal oxidation time and the short-circuit current density.

Figure 5B:
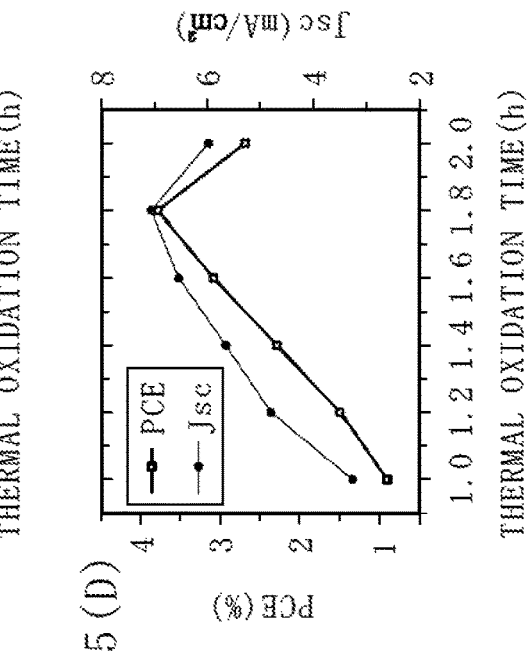
FIG. 5(B) is a graph showing relationships between thermal oxidation time and the fill factor and between the thermal oxidation time and open circuit voltage.
Figure 5C:
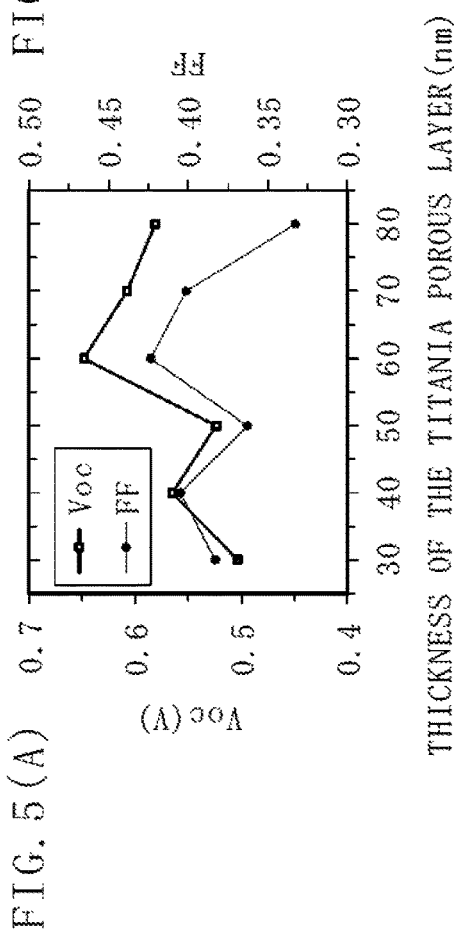
FIG. 5(C) is a graph showing relationships between the thickness of the titanium porous layer and power conversion efficiency and between the thickness of the titanium porous layer and short-circuit current density.

From FIGS. 5(A) and 5(C), it was found that an optimal value of the thickness of the titanium porous layer is 60 nm, at which the power conversion efficiency, the short-circuit current density, the fill factor, and the open circuit voltage all exhibit the maximum values. It is considered that all of the power conversion efficiency, the short-circuit current density, the fill factor, and the open circuit voltage decrease when the thickness of the titanium porous layer is less than 60 nm because the sheet resistance of the titanium porous layer increases and the capture of electrons by the titanium porous layer is obstructed. Also, it is considered that all of the power conversion efficiency, the short-circuit current density, the fill factor, and the open circuit voltage also decrease when the thickness of the titanium porous layer exceeds 60 nm because the amount of perovskite present inside the titanium porous layer decreases due to narrowing of the distance between titanium particles (improvement in filling property) in accordance with the increase in the thickness of the titanium porous layer and the diffusion of holes is obstructed accordingly.

Figure 5D:
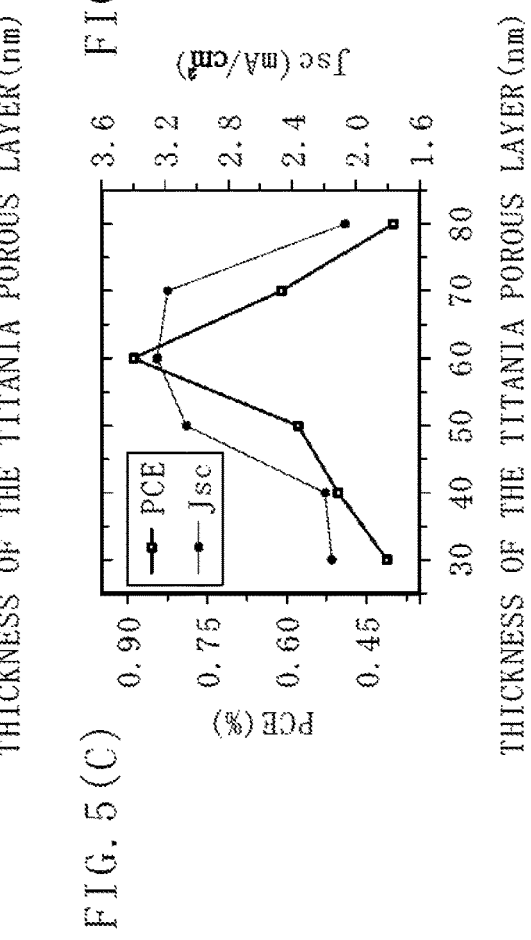
FIG. 5(D) is a graph of relationships between the thermal oxidation time and the power conversion efficiency and between the thermal oxidation time and short-circuit current density in the examples.

From FIGS. 5(B) and 5(D), the thermal oxidation time at which the power conversion efficiency, the short-circuit current density, the fill factor, and the open circuit voltage all exhibit the maximum values is 1.8 hours. It was thus found that in order to form the titanium oxide layers on the surfaces of the titanium particles constituting the titanium porous layer with a thickness of 60 nm such that the photoelectric conversion performance is maximized, it is necessary to perform thermal oxidation processing at 400° C. for 1.8 hours. It is considered that with a thermal oxidation time of less than 1.8 hours, titanium oxide layers of a thickness that would provide the function of selectively capturing electrons and excluding holes cannot be formed and with a thermal oxidation time exceeding 1.8 hours, the sheet resistance of the titanium porous layer increases in accordance with increase in thickness of the titanium oxide layers and the capture of electrons by the titanium porous layer will be obstructed.

Figure 6A:
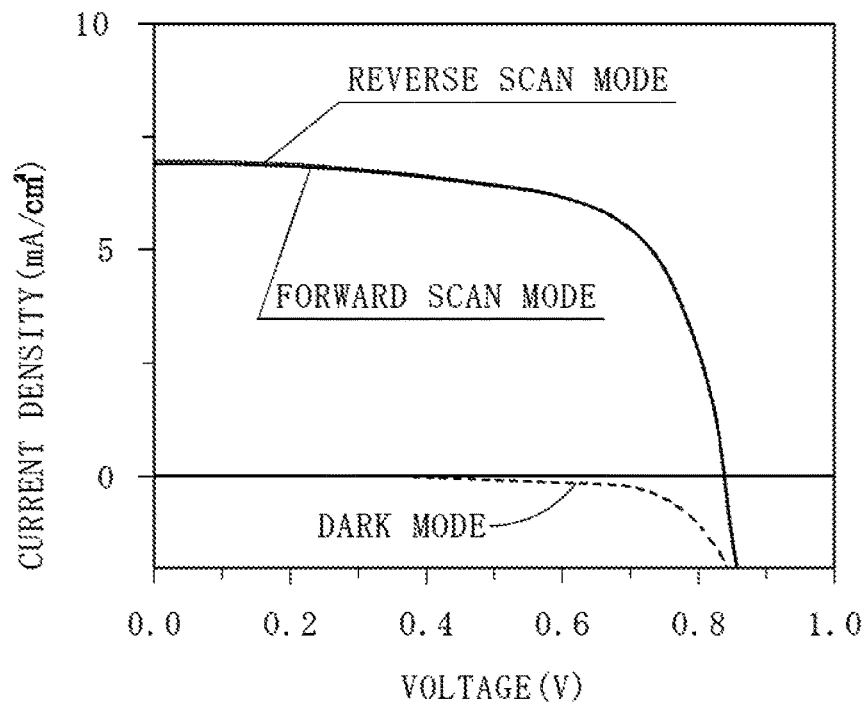
FIG. 6(A) is a graph showing a relationship between voltage and current density of the back contact type perovskite photoelectric conversion element in the examples and FIG. 6(B) is a graph showing results of an operation stability test.

A back contact type perovskite photoelectric conversion element, prepared with the thickness of the titanium porous layer set to 60 nm and the thermal oxidation time set to 1.8 hours, was provided with a black mask to arrange an exposure area of 0.12 cm$^2$ and using a solar simulator, current and voltage characteristics were measured in two scan modes. The results are shown in FIG. 6(A). In a forward scan mode (voltage boost from 0 V to the open circuit voltage), the values of the short-circuit current density, the open circuit voltage, and the fill factor were 7.07 mA/cm$^2$, 0.84V, and 0.66, respectively. In a reverse scan mode (voltage step-down from the open circuit voltage to 0V), the values of the short-circuit current density, the open circuit voltage, and the fill factor were 7.10 mA/cm$^2$, 0.83V, and 0.66, respectively. In both the forward direction and reverse direction scan modes, the power conversion efficiency of the back contact type perovskite photoelectric conversion element was 3.88% and a hysteresis phenomenon, which has been indicated for conventional perovskite solar cells, did not appear.

Figure 6B:
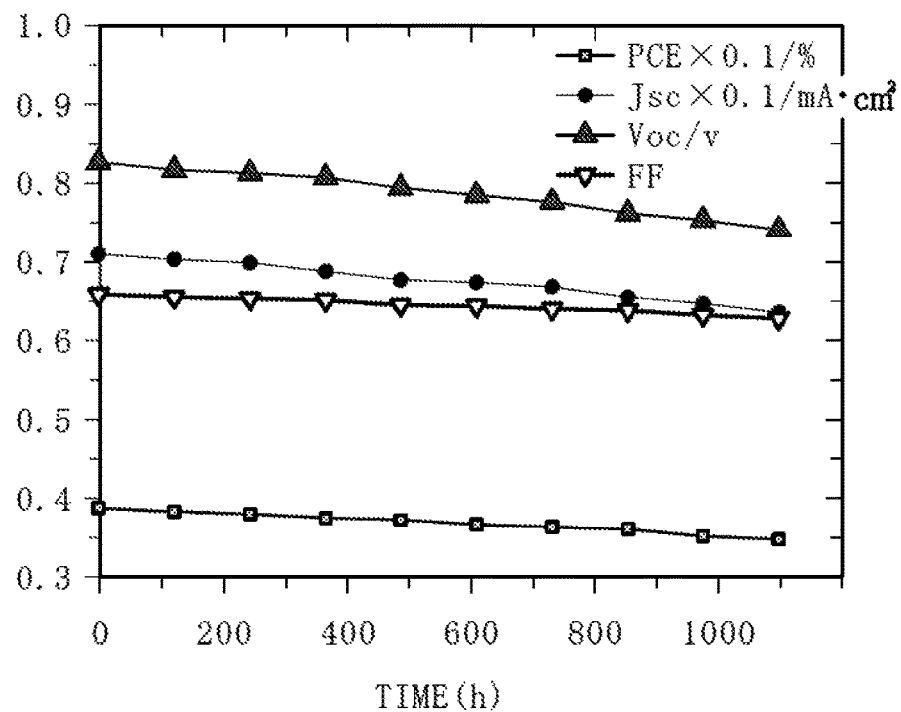

A back contact type perovskite photoelectric conversion element, prepared with the thickness of the titanium porous layer set to 60 nm and the thermal oxidation time set to 1.8 hours, was provided with a black mask to arrange an exposure area of 0.12 cm$^2$ and light of a light intensity of 100 mW/cm$^2$ was irradiated from a solar simulator to test operation stability. The power conversion efficiency, the short-circuit current density, the fill factor, and the open circuit voltage were measured at every 120 hours and the results are shown in FIG. 6(B). In FIG. 6(B), in order to indicate the power conversion efficiency, the short-circuit current density, the fill factor, and the open circuit voltage using a common ordinate scale, values obtained by multiplying the respective measured values by 0.1 are plotted for the power conversion efficiency and the short-circuit current density. The power conversion efficiency exhibited an attenuation of 9.6% over a period of 1080 hours and it was confirmed that the back contact type perovskite photoelectric conversion element exhibits excellent stability.

Although the present invention has been described above with reference to the preferred embodiment, the present invention is by no means restricted to the arrangement described for the embodiment above and includes other embodiments and modification examples conceivable within the scope of the matters described in the scope of the claims.

Further, combinations of constituents respectively included in the present embodiment and the other embodiments and modification examples are also included in the present invention.

For example, although, as the porous insulating layer in the present embodiment, that which is arranged by connecting zirconium oxide particles in a three-dimensional network is used, any one of aluminum oxide particles, silicon oxide particles, yttrium oxide particles, and indium oxide particles maybe used in place of the zirconium oxide particles. Further, a nonwoven fabric of organic fibers may be used as the porous insulating layer.

Although titanium oxide particles are used as the metal oxide particles, any one of zinc oxide particles, tin oxide particles, aluminum oxide particles, silicon oxide particles, yttrium oxide particles, zirconium oxide particles, and indium oxide particles may be used.

Although titanium particles are used as the metal particles constituting the metal porous layer, the metal particles may be formed of any one of or a combination of any two or more of or an alloy of any one of titanium, copper, aluminum, and nickel.

As the first electrode layer, any one of carbon, silver, and platinum may be used in place of gold.

Further, although, as has been described with the present embodiment, it is preferable for the metal constituting the second electrode layer to be of the same material as the metal constituting the metal porous layer, the second electrode layer may be constituted of a material different from the metal constituting the metal porous layer.

DESCRIPTION OF THE SYMBOLS

10: back contact type perovskite photoelectric conversion element, 11: glass substrate, 12: titanium oxide particles, 13: titania porous layer, 14: titanium particles, 15: titanium porous layer, 16: zirconium oxide particles, 17: zirconia porous layer, 18: gold electrode layer, 19: titanium electrode layer, 20: perovskite, 21, 21*a*: titaniumoxide layer, 22: titanium connection portion, 23, 23*a*: titanium oxide layer.

What is claimed is:

1. A back contact type perovskite photoelectric conversion element comprising:
    a light transmitting substrate, on a front surface of which light is made incident;
    an oxide porous layer formed on a rear surface of the light transmitting substrate, the oxide porous layer having a thickness not less than 50 nm and not more than 2000 nm, the oxide porous layer being made of metal oxide particles connected in a network forming continuous pores with a pore diameter of 10 to 300 nm;
    a metal porous layer formed on a rear surface of the oxide porous layer, the metal porous layer having a thickness not less than 30 nm and not more than 1000 nm, the metal porous layer being made of metal particles connected in a network forming continuous pores with a pore diameter of 2 to 50 nm formed;
    a porous insulating layer formed on a rear surface of the metal porous layer, the porous insulating layer having a thickness not less than 50 nm and not more than 1000 nm;
    a first electrode layer, formed on and across an entirety of a rear surface of the porous insulating layer;
    a second electrode layer, connected to the metal porous layer, and formed at a portion different from the first electrode layer in a state of being insulated from the first electrode layer, and constituted of the same material as the metal constituting the metal porous layer; and
    perovskite, filled continuously inside the respective pores of the oxide porous layer, the metal porous layer, and the porous insulating layer; and
    wherein oxide layers of the metal particles having a thickness of 1 to 100 nm are formed on surface layers of the metal particles in contact with the perovskite.

2. The back contact type perovskite photoelectric conversion element according to claim 1, wherein the metal oxide particles are any one of titanium oxide particles, zinc oxide particles, tin oxide particles, aluminum oxide particles, silicon oxide particles, yttrium oxide particles, zirconium oxide particles, and indium oxide particles.

3. The back contact type perovskite photoelectric conversion element according to claim 1, wherein the metal particles are formed of any one of or a combination of any two or more of or an alloy of any one of titanium, copper, aluminum, and nickel.

4. The back contact type perovskite photoelectric conversion element according to claim 1, wherein the porous insulating layer has any one of aluminum oxide particles, silicon oxide particles, yttrium oxide particles, zirconium oxide particles, and indium oxide particles connected in a network.

5. The back contact type perovskite photoelectric conversion element according to claim 1, wherein the first electrode layer is formed of any one of carbon, silver, platinum, and gold.

* * * * *